US011809236B2

(12) United States Patent
Khalifeh (10) Patent No.: US 11,809,236 B2
(45) Date of Patent: Nov. 7, 2023

(54) HOUSING PART FOR ELECTRONIC DEVICE (71) Applicant: Carbon Mobile GmbH, Berlin (DE)

(72) Inventor: Firas Khalifeh, Berlin (DE)

(73) Assignee: CARBON MOBILE GmbH, Berlin (DE)

(*) Notice: Subject to any disclaimer, the term of this patent is extended or adjusted under 35 U.S.C. 154(b) by 0 days.

(21) Appl. No.: 18/019,273

(22) PCT Filed: Jan. 26, 2022

(86) PCT No.: PCT/IB2022/050663
§ 371 (c)(1),
(2) Date: Feb. 2, 2023

(87) PCT Pub. No.: WO2022/162541
PCT Pub. Date: Aug. 4, 2022

(65) Prior Publication Data
US 2023/0229198 A1 Jul. 20, 2023

(30) Foreign Application Priority Data
Jan. 27, 2021 (DE) .......................... 102021101818.8

(51) Int. Cl.
G06F 1/16 (2006.01)
H04M 1/02 (2006.01)
H05K 9/00 (2006.01)

(52) U.S. Cl.
CPC ........ *G06F 1/1656* (2013.01); *H04M 1/0249* (2013.01); *H05K 9/009* (2013.01); *H05K 9/0039* (2013.01)

(58) Field of Classification Search
CPC ........................... G06F 1/1656; H05K 9/0039
See application file for complete search history.

(56) References Cited

U.S. PATENT DOCUMENTS

2008/0129638 A1* 6/2008 Ong .......................... H01Q 1/40
343/873
2015/0024811 A1 1/2015 Yoon et al.

OTHER PUBLICATIONS

International Search Report dated May 11, 2022.
Written Opinion of the International Searching Authority dated May 23, 2022.

* cited by examiner

*Primary Examiner* — Anthony Q Edwards
(74) *Attorney, Agent, or Firm* — Ralph E. Jocke; WALKER & JOCKE (57) ABSTRACT

Exemplary arrangements relate to a housing part (100) for an electronic terminal such as a cell phone. The housing part is comprised of carbon fiber reinforced plastic and includes at least one conductive device such as a threaded metallic insert (110) configured for galvanic connection to the electronics that are housed within a housing of the terminal. In an exemplary arrangement the housing part includes a groove (120). The groove is filled with a conductive mass (130) which provides a galvanic connection to the exposed carbon fibers within the groove. The carbon fibers may thereby be in galvanic connection with the ground of the electronics within the housing part, which helps to suppress electronic noise which may be produced by the electronics.

14 Claims, 7 Drawing Sheets

HOUSING PART FOR ELECTRONIC DEVICE

TECHNICAL FIELD

An exemplary arrangement relates to a housing part for an electronic device, consisting essentially of carbon fiber-reinforced plastic, wherein the housing part has at least one device for galvanic connection to the electronics arranged in the housing.

DISCUSSION

Electronic devices, which are referred to herein as terminals or devices, and that have electronics that are enclosed, usually require a housing part that protects the electronics themselves from external environmental influences, and also that protects the environment from interference produced by electronics.

Electronic devices with an electronic oscillating circuit require a housing which itself has an electrical ground potential to prevent the housing from having a capacitive effect and thus itself forming an unwanted part of an unwanted oscillating circuit which, together with the electronics, generates electronic noise in the oscillation produced.

The aforementioned problem of noise which is alternatively referred to herein as interference, arises particularly in high-frequency applications, such as radio receivers, radios, and cell phones, and also in mobile data acquisition devices that send data acquired via a near- to mid-field protocol to a remote data acquisition device. Such mobile data acquisition devices can be sensors of various types, as known in the field called "Internet-of-Things".

Known cell phones either have an electrically non-conductive plastic housing, so that the oscillating circuit and noise problems cannot arise, or they have a metallic housing that is pulled to electrical ground by an electrical connection to the electrical ground conductor, the electronics located in the housing.

Metal housings for cell phones have the advantage of extreme robustness, but have the disadvantage of high weight due to the specific density of the material. When it comes to optimizing the weight of a cell phone, every gram saved counts, so cell phones can be carried in interior pockets, with even small differences in weight having a significant impact on wearing comfort. In addition to robustness, metallic housings for cell phones can also perform parts of the antenna function, which is not possible with non-conductive plastic housings.

In order to save weight, it is known to produce a housing for a cell phone from carbon fiber reinforced plastic. Carbon fiber reinforced plastic may be in the form of a composite material in which the carbon fibers form a fabric that has been previously impregnated with non-set plastic. Such impregnated fabrics are referred to as "prepregs." To produce an article from carbon fiber-reinforced plastic, prepregs are placed in a mold and, under the influence of heat, the plastic surrounding the carbon fibers sets. As an alternative to prepregs, carbon fiber reinforced plastics are also produced as castings. In cast carbon-fiber-reinforced plastics, the carbon fibers are present in the plastic as short, chopped fibers, with the chopped fibers statistically distributed throughout the plastic. Both carbon fiber reinforced prepreg moldings and carbon fiber reinforced castings can be parts of a composite. Finally, it is also possible to combine carbon fiber reinforced prepregs and carbon fiber reinforced plastic as castings to form a composite material. Finally, carbon fiber-reinforced plastic can also be joined with thermoplastic plastic, which does not necessarily have to contain carbon fibers, by overmolding to form a composite. The use of carbon fiber-reinforced plastic and/or composites thereof for a cell phone or other terminal housing has the advantage that a relatively large amount of weight can be saved compared with a metallic housing, and the carbon fiber-reinforced plastic is electrically conductive in its carbon fibers with quite low electrical resistance.

In some types of terminal housing arrangements carbon fibers of carbon fiber reinforced plastic can form a desirable Faraday cage and optionally participate in the antenna function of the cell phone. Because the carbon fibers of carbon fiber-reinforced plastic are electrically conductive, the carbon fibers can form an undesirable part of an unwanted resonant circuit, just like a metallic case. As a result, an electronic noise problem can arise when a housing made of carbon-fiber-reinforced plastic is used for a cell phone, and the housing cannot be easily pulled to an electrical ground. In such arrangements the individual carbon fibers are surrounded by a non-conductive organic plastic layer in the plastic surrounding them. Thus, the individual fibers have an ungrounded potential. The technical term for this state is "high impedance state", which means that the individual fibers do not have an earthed potential or at least do not have a ground potential, whereby the electrical ground of an electronic device does not necessarily have to have the electrical potential of the earth.

As a result housings for electronic terminals may benefit from improvements.

SUMMARY

Exemplary arrangements provide a housing for an electronic device which consists essentially of carbon fiber-reinforced plastic and does not have the noise or other problems described above.

In exemplary arrangements such terminal housings have at least a device for galvanic connection to the electronics arranged in the housing. For example in some arrangements the device may be configured for fastening a frame for accommodating electronics. An exemplary housing part has adjacent to at least one device for galvanic connection to the electronics arranged in the housing, at least one groove in the housing part which is filled with a set conductive mass. The conductive mass is galvanically connected to the device, and the mass is configured for galvanic connection itself to the electronics arranged in the housing. Exemplary arrangements provide the terminal housing of carbon fiber reinforced plastic with a ground potential by galvanically connecting the carbon fibers of a carbon fiber reinforced plastic, of which the housing is substantially made, to the at least one device for galvanic connection to the electronics arranged in the housing. The at least one groove in the housing is advantageously introduced by milling after the plastic has set or solidified. Milling exposes the individual carbon fibers. In exemplary arrangements some carbon fibers are cut through which have a length that extends over an entire length of the housing part, so that the cross-section of the individual carbon fibers is exposed. Other carbon fibers are milled laterally so that one side of a carbon fiber is exposed. Still other carbon fibers are cut at an angle so that an angled cut face of the carbon fiber is exposed. Because carbon fibers have an electrical resistivity comparable to the electrical resistivity of many metals, milling into the surface of the housing is similar to exposing individual cores of a copper cable.

In some exemplary arrangements the electrically conductive compound which provides the mass in the groove can be an electrically conductive ink. Silver inks that have a suspension of silver particles in liquid or paste form may be suitable for this purpose. When the ink carrier sets, the silver particles come into contact with each other, as a result of which the ink in the set state has a comparatively low electrical resistance even over longer distances. Conductive inks have the advantage that they can be applied cold, i.e. at room temperature. Depending on the nature of the plastic in the carbon fiber-reinforced plastic, a silver-based or tin-based soft solder can also be used as a conductive compound which provides the conductive mass in the groove. In some arrangements if the plastic of the carbon fiber-reinforced plastic is an epoxy resin, it is possible to fill the groove with soft solders which have a melting temperature of below 300° C., preferably below 200° C., and to bring them into galvanic contact with the carbon fibers on the one hand and with the at least one device for galvanic connection to the electronics arranged in the housing on the other.

Suitable plastics for exemplary terminal housing parts are carbon fiber reinforced plastic, wherein the plastic may be a thermoplastic polymer or a thermoset polymer. In some exemplary arrangements the housing parts may include carbon fiber reinforced plastics having an electrically conductive plastic. Indeed, despite the electrical conductivity of the plastic, the carbon fibers therein may be electrically isolated from the electrically conductive plastic by a release layer on the surface of the carbon fibers. In the context of this application, "carbon fiber-reinforced plastic" refers to any type of plastic or composite that includes carbon fiber scrims, carbon fiber fabrics, knitted carbon fiber fabrics, and/or knitted carbon fiber fabrics for mechanically reinforcing the plastic or composite. Composites may, for example, have one or more layers in which a single layer or multiple layers consist of a set carbon fiber reinforced epoxy resin and other single or multiple layers consist of a thermoplastic bonded to the carbon fiber reinforced epoxy resin by overmolding. The electrical conductivity of the plastic may have been obtained by admixture of electrically conductive filler materials or may cumulatively or alternatively consist of electrically conductive plastic polymers, such as doped polypyrrole or other doped or undoped polyannulated plastics, such as poly-3,4-ethylenedioxythiophene (PEDOT), polyaniline, polyparaphenylene or polythiophene, or mixtures thereof. Plastic blends of plastics of different types to highlight special properties are typically referred to as 'compounds' in industry terms. Compounds include high-performance plastics, mixtures of plastics, and plastics consisting of more than one ply, where the plies have different plastics.

As a housing part for a cell phone as an electronic device, it is particularly considered that the structure has a lid-like structure in which a substantially flat rear face which is alternatively referred to herein as a front, has a side edge, wherein in the inner corner between the substantially flat rear front and the side edge there is a step-like elevation within which the at least one device for galvanic connection to the electronics arranged in the housing is positioned. The device for galvanic connection with the electronics arranged in the housing thus has its seat in the step-like elevation. In this case, the step-like elevation may be made of a cast plastic, for example, a thermoplastic plastic or even a carbon fiber reinforced cast plastic. This part of the housing can be a layer produced by an overmolding process. When the exemplary housing is overmolded, a housing blank made of prepregs is first placed in a mold and heated in the mold. This causes the plastic to cure in the mold. Then, in the same mold or in another mold, the housing blank is overmolded with a plastic layer made of a further plastic by injecting the further plastic onto the housing blank. The injection mold already contains the at least one device for galvanic connection with the electronics arranged in the housing, which are connected to the housing blank by the cast or injection-molded plastic. For this purpose, the at least one device for the galvanic connection with the electronics arranged in the housing can be a metallic threaded insert or an electrically conductive contact surface or piece, which is later electrically connected to the PCB via an electrically conductive pouch.

Depending on the shape of the housing, the introduction of a groove into the housing can lead to an undesirable potential weakened breaking point because the groove represents an unwanted weakening of the material. In this case, it depends on the geometry of the housing whether and how mechanical stresses are propagated in the housing in such a way that the groove forms a potential breaking edge. In order to avoid the formation of a potential fracture edge regardless of the housing geometry, it can be provided that the groove is meander-shaped. In this case, the meander structure is aligned with and extends along a line approximately parallel to a housing edge. The approximate parallelism of the line of extension of the meander-shaped groove means that the housing edge absorbs the mechanical forces in the area of the groove to such an extent that a potential break area in the groove does not occur.

If, for example, the housing is constructed from several prepreg layers or layers of different plastics, it is advantageous if provision is made for the groove to pierce and extend completely through at least one layer of carbon fiber-reinforced plastic in depth. This ensures that at least one innermost shell of the housing has an electrical ground potential. In order to improve the galvanic connection of the electrically conductive ground to the metallic threaded insert so that the lowest possible electrical contact resistance is produced, it may be provided that the metallic threaded insert has a milled on spot, the conductive ground being galvanically connected to the milled spot. By milling, possible surface finishes, coatings and/or non-conductive metallic oxide layers are broken through and the wetting of the metallic thread insert by the electrically conductive compound, be it an electrically conductive ink or a soft solder, is intensified while forming the lowest possible electrical contact resistance.

Additional features of exemplary arrangements are shown in the appended drawings and are discussed in the Detailed Description.

BRIEF DESCRIPTION OF DRAWINGS

FIG. 2 is an enlarged view of detail A from FIG. 1 with section plane B drawn in.

DETAILED DESCRIPTION

Figure 1:
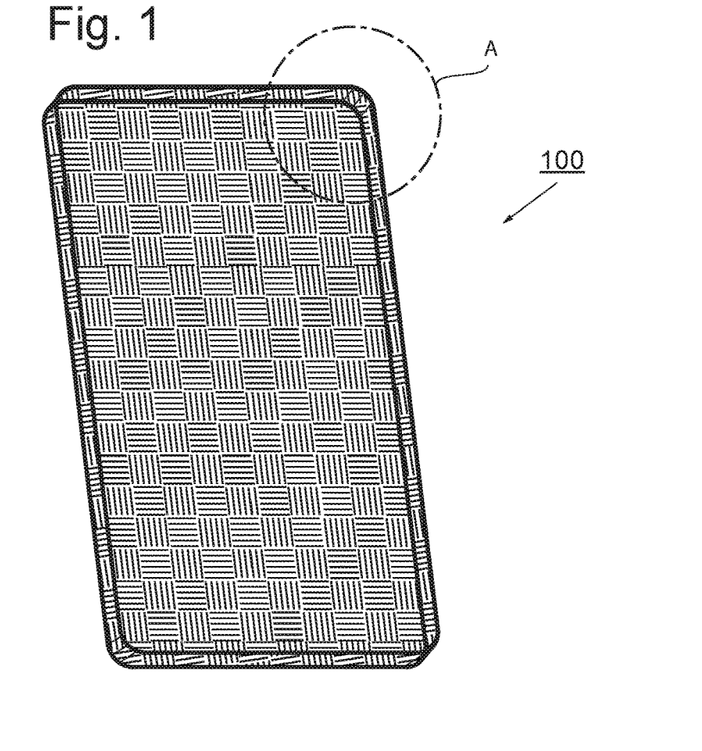
FIG. 1 is an illustration of a rear housing part of a cell phone or other electronic terminal device that includes the area of detail A.

In FIG. 1, a view of the inside is shown on a back cover of an exemplary housing part 100 of a terminal such as cell phone or other electronic device. In FIG. 1, a circle is shown around an area of the housing part referred to as detail A, which is enlarged and shown with further details in the following FIG. 2.

Figure 2:
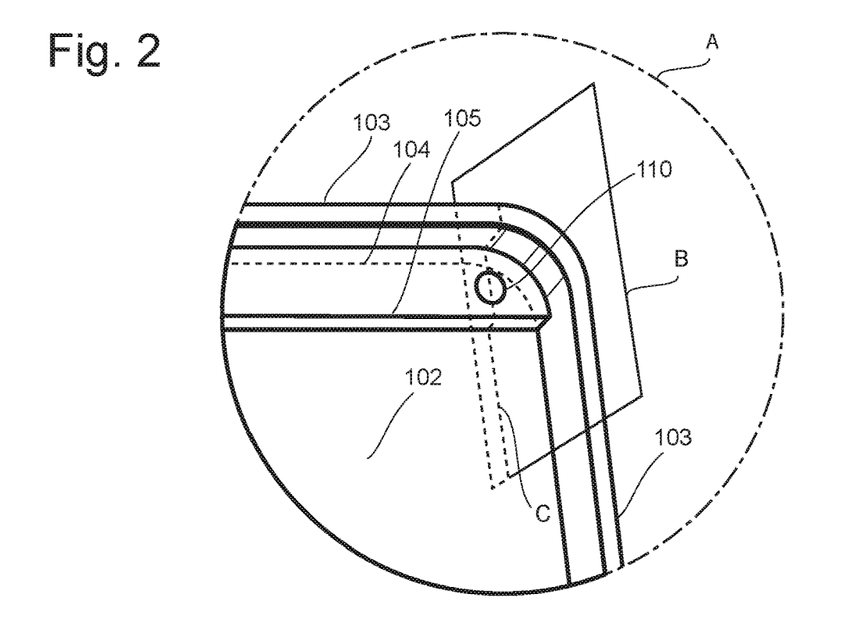
Figure 3:
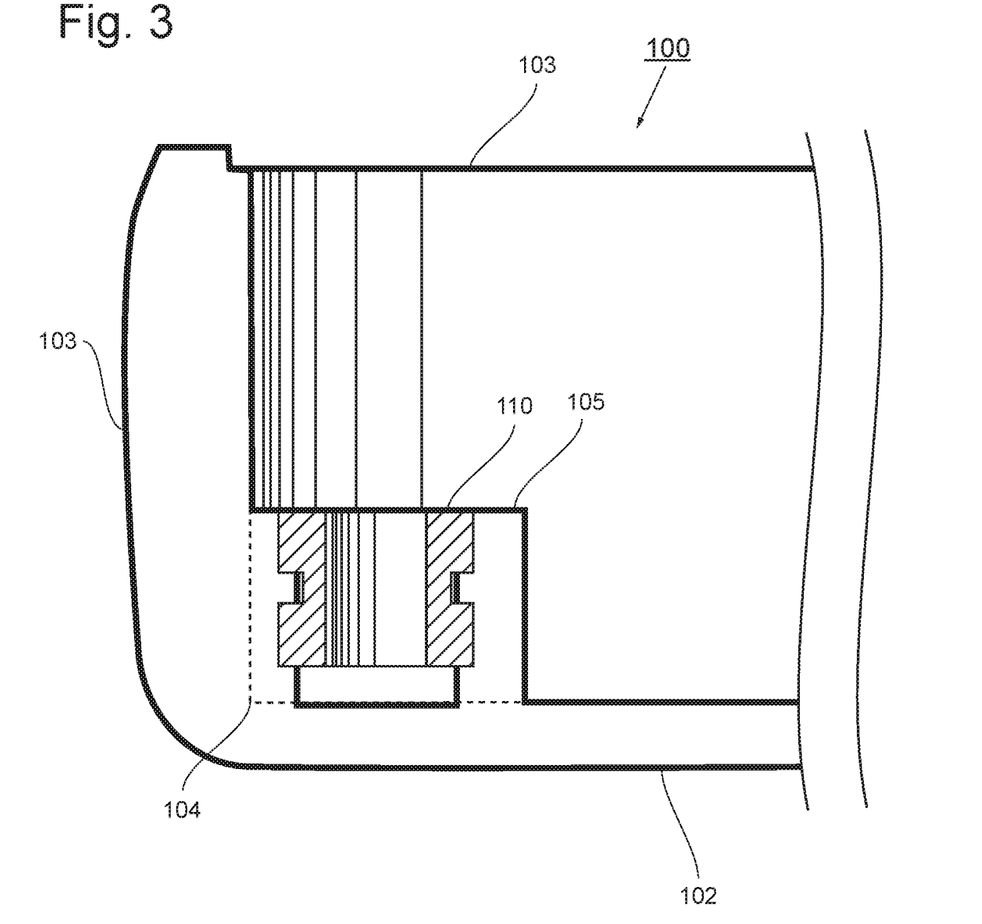
FIG. 3 is a cross sectional view in the sectional plane B in FIG. 2.

In FIG. 2, detail A of FIG. 1 is shown in an enlarged view with further details. A section plane B is shown in the upper right corner of the housing part 100, which forms a section line C with the housing part 100. A view of the sectional plane B is shown in FIG. 3. In FIG. 2, it is shown that a step-shaped protrusion/elevation 105 is disposed in the upper inner corner 104 between a substantially planar rear face 102 and a side edge 103 of the housing part. In this step-shaped elevation 105, a metallic threaded insert 110 is held in formed connection with the housing part by overmolding, which is explained in more detail in connection with FIG. 3.

Figure 4:
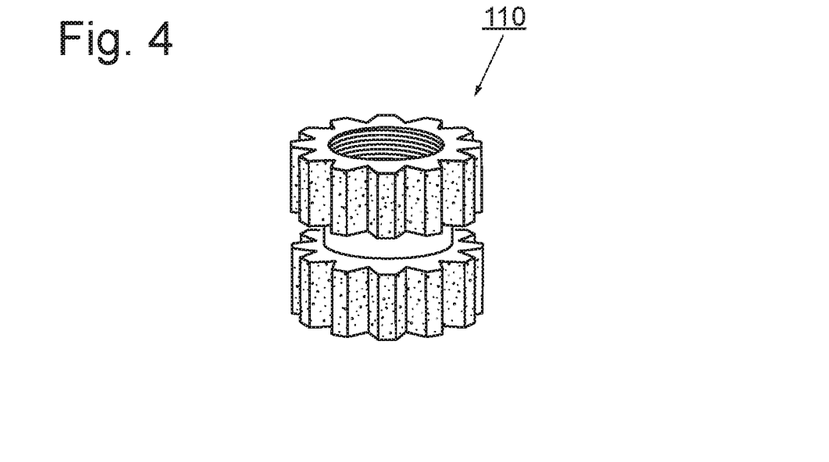
FIG. 4 shows an exemplary threaded insert as inserted in the housing.

FIG. 3 shows a view of the sectional plane B of FIG. 2 in a view from the left side in FIG. 2. An exemplary metallic threaded insert 110, shown in FIG. 4, is held in place by being molded by overmolding into the step-shaped elevation 105, which is located in an inner corner 104 between the substantially flat rear face 102 and a side edge 103. This metallic threaded insert 110 is used for fastening a mounting frame of electronics or for fastening a printed circuit board. In this case, the frame or the fastening point of the circuit board can be connected to a metallic conductor which has an electrical ground potential of the electronics. In order to pull the housing part 100 to ground over a large area in the electrotechnical sense, it is now intended to galvanically connect the metallic threaded insert 110, which here in this exemplary arrangement is seated in a part of the composite housing which has been created by overmolding with plastic of low electrical conductivity, to the carbon fibers 101 of the housing.

FIG. 4 illustrates an exemplary threaded insert 110 that is used in the exemplary housing part 100 to secure a circuit board or mounting frame with a screw.

Figure 5:
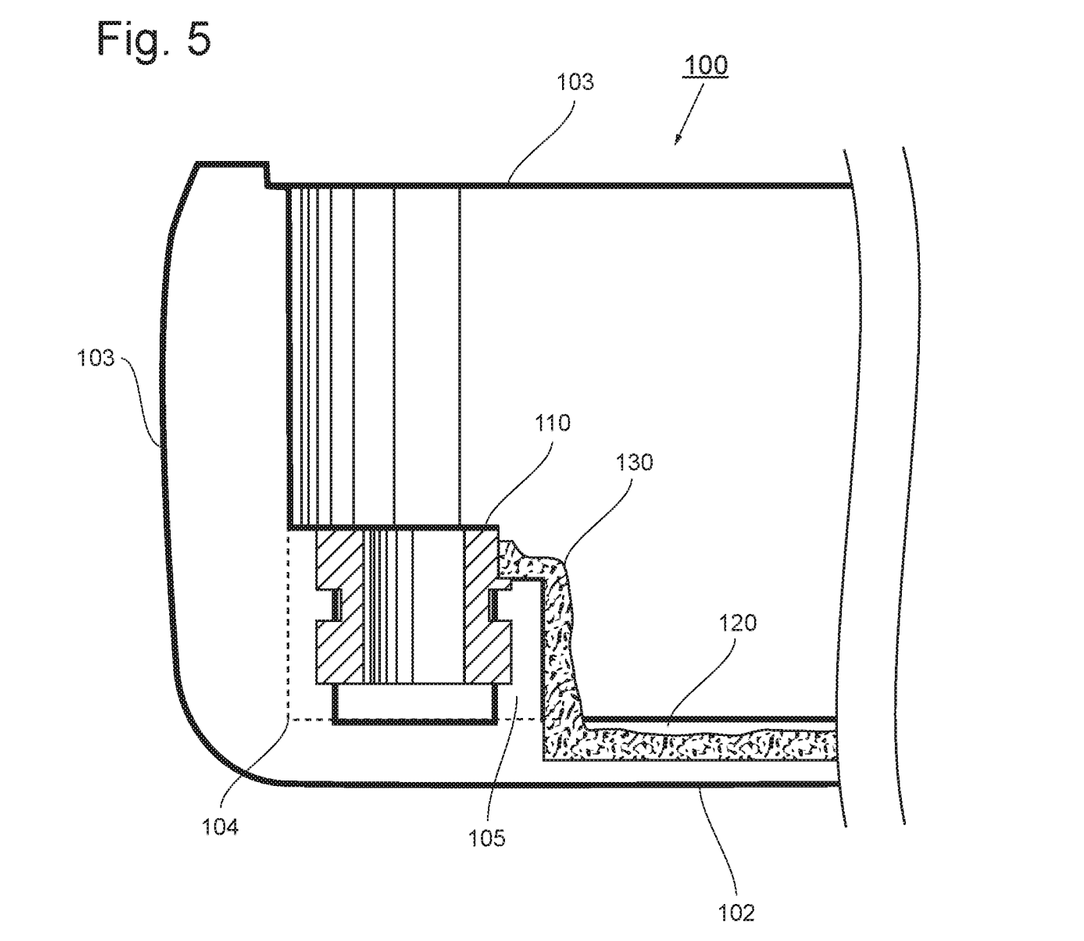
FIG. 5 is a cross sectional view in section plane B in FIG. 2 from detail A with a filled groove according to an exemplary arrangement.

In FIG. 5, the view of FIG. 3 is supplemented by the electrically conductive mass 130 according to an exemplary arrangement in a groove 120 adjacent to the threaded insert 110. The groove 120 is inserted in exemplary arrangements by milling into the rear face 102, and carbon fibers 101 are exposed by the insertion of the groove 120. The electrically conductive mass 130, for example electrically conductive ink or soft solder fills the groove 120 and galvanically connects the exposed carbon fibers 101 to the metallic threaded insert 110, allowing electrical current to flow from the threaded insert 110 via the electrically conductive mass 130 into the carbon fibers 101 exposed in the groove 120 and vice versa. As a result of the electrically conductive connection, the exemplary housing part 100 exhibits an electrical potential of the threaded insert 110. The threaded insert 110 may in some arrangements be connected to a mounting frame not shown here, which is itself electrically grounded, or in some arrangements the threaded insert 110 may be connected to an electrical ground contact on an electronic circuit board via a corresponding screw. As a result, the housing then also exhibits an electrical ground potential. If a high-frequency antenna is now installed in the housing part 100, as is common for cell phones or for terminals such as mobile data acquisition devices that transmit data to a remote data collection station via a local radio network (e.g. WLAN, LTE, GSM) or via a near-field protocol (e.g. BluTooth), the electrical ground potential of the housing part 100 prevents the housing from being the cause of electronic noise. In order to improve the electrical connection of the threaded insert 110 with the electrically conductive mass, i.e. to provide it with the lowest possible electrical contact resistance, it can be advantageous if the threaded insert 110 has at least one milled spot externally, as shown in FIG. 6.

Figure 6:
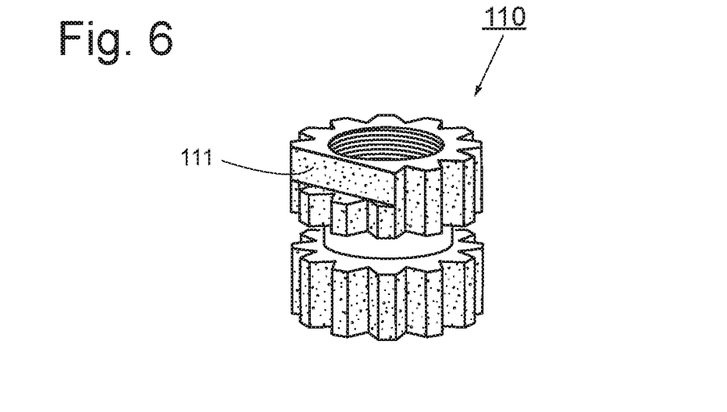
FIG. 6 is an exemplary milled threaded insert.

In FIG. 6, the exemplary threaded insert 110 is shown with a milled spot 111. If the milled spot 111 is freshly produced at the time of production of the housing part, bare metal is exposed and free of oxides, lacquers and/or surface finishes. The bare metal can be easily wetted and electrically connected with the electrically conductive mass 130.

Figure 7:
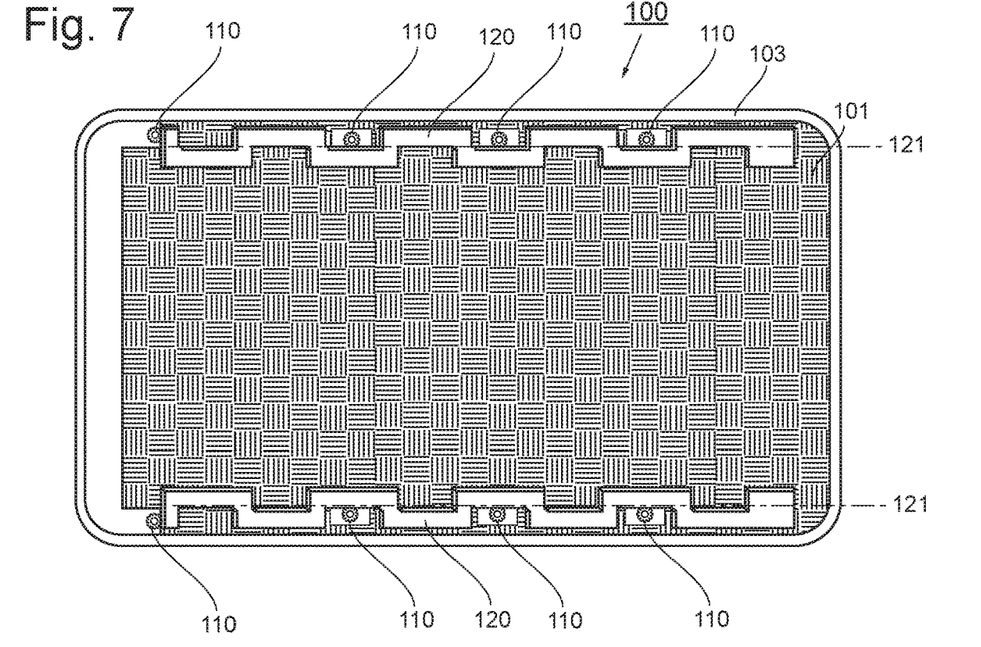
FIG. 7 is a view of the inside of an exemplary housing part with a meander-shaped groove.

FIG. 7 shows a detailed internal view of the exemplary housing part 100, which has a groove 120 adjacent to a plurality of threaded inserts 110. In order to prevent the groove 120 from acting as a potential weakened breaking point, the exemplary groove 120 has a meandered design. In this case, the line of extension 121 of the groove 120 runs parallel to the side edge 103. This exemplary arrangement allows the side edge 103 to absorb mechanical forces that arise in the area of the groove 120 when the housing part 100 is mechanically loaded. Due to the meandering configuration of the groove, the mechanical stress lines extend to such an extent that fracture does not preferentially occur in the meandering line of the groove 120.

Figure 8:
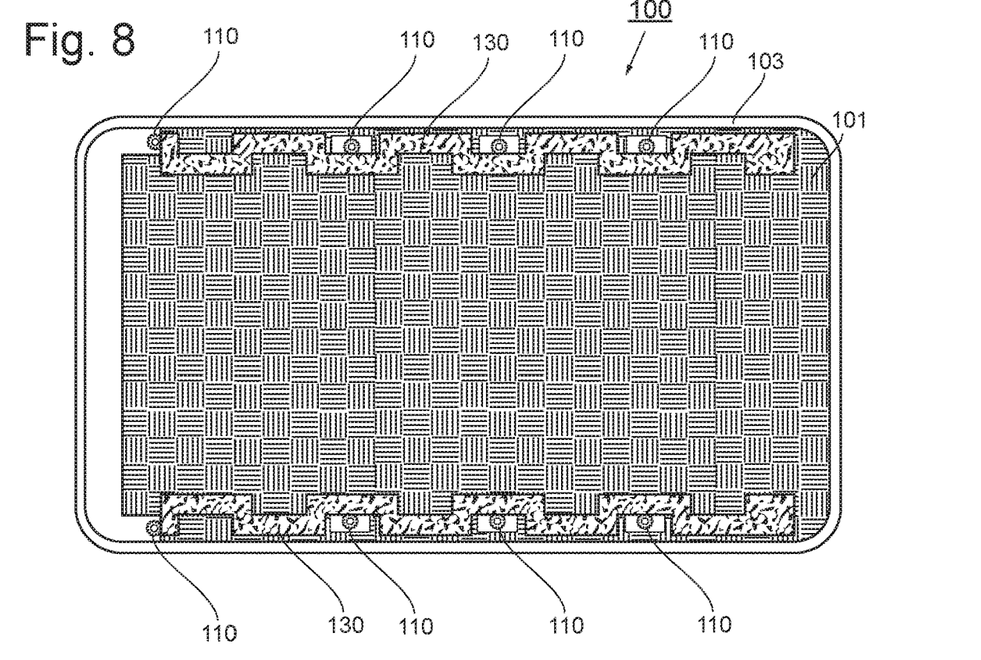
FIG. 8 is a view of the inside of a housing part according to an exemplary arrangement with a meander-shaped groove filled with an electrically conductive mass or compound.

Finally, FIG. 8 shows a detailed internal view of the exemplary housing part 100, with the groove 120 filled with an electrically conductive mass 130. The carbon fibers 101 are exposed in the groove 120, so that the electrically conductive ground galvanically connects the carbon fibers 101 to the threaded inserts. Now, if each threaded insert 110 is connected to an electrical ground potential, the carbon fibers 101 are also at the ground potential. The electrically conductive mass 130 in the groove 120 also connects the various threaded inserts 110 to each other, so that all threaded inserts 110 have the same electrical potential. Via the path via the threaded inserts 110, which may themselves be connected to an electrical contact on a circuit board via a corresponding screw, the electrically conductive mass 130 in the groove 120 assumes the function of a conductor path which is preferably used for grounding or potential equalization of different individual parts of the electronic device. The mobile telephone mentioned here as an example is representative of other electronic devices, such as radios or other devices with a radio remote connection or radio receivers.

Figure 9:
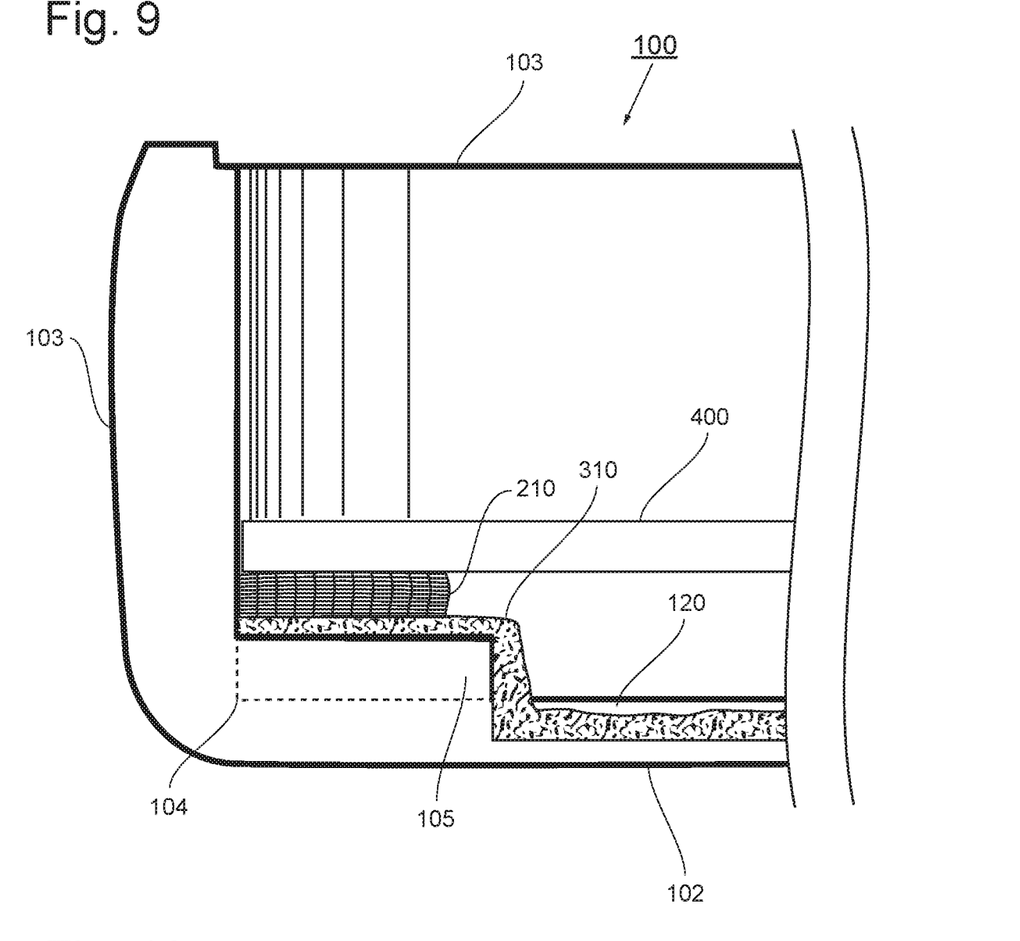
FIG. 9 is a view of an alternative exemplary arrangement of the housing part with an electrically conductive sponge.

FIG. 9 shows an alternative arrangement of the housing part with an electrically conductive sponge 210. The view is similar to the view in FIG. 5, but the metallic threaded insert 110 is replaced by an electrically conductive bearing surface on which an electrically conductive sponge 210 rests. The groove 120 is formed in the rear face 102, with carbon fibers 101 being exposed by the formation of the groove 120. The electrically conductive mass 130, for example electrically conductive ink or soft solder, fills the groove and galvanically connects the carbon fibers 101 to the overlying electrically conductive sponge 210, allowing electrical current to flow through the electrically conductive sponge 210 and via the electrically conductive mass 130 into the carbon fibers 101 exposed in the groove 120 and vice versa. As a result of the electrically conductive connection, the housing part 100 exhibits an electrical potential of the electrically conductive sponge 210. The electrically conductive sponge 210 may be connected to a mounting frame not shown here, which is itself electrically grounded, or the electrically conductive sponge 210 may serve as a support point for an electronic circuit board 400. As a result, the housing then also exhibits an electrical ground potential. If a high-frequency antenna is installed in the housing part 100, as is common for cell phones or for mobile data collection devices that transmit data to a remote data collection station via a local wireless network (WLAN) or via a near-field protocol (BlueTooth), the electrical ground potential of the housing part 100 prevents the exemplary housing part from being the cause of electronic noise.

Figure 10:
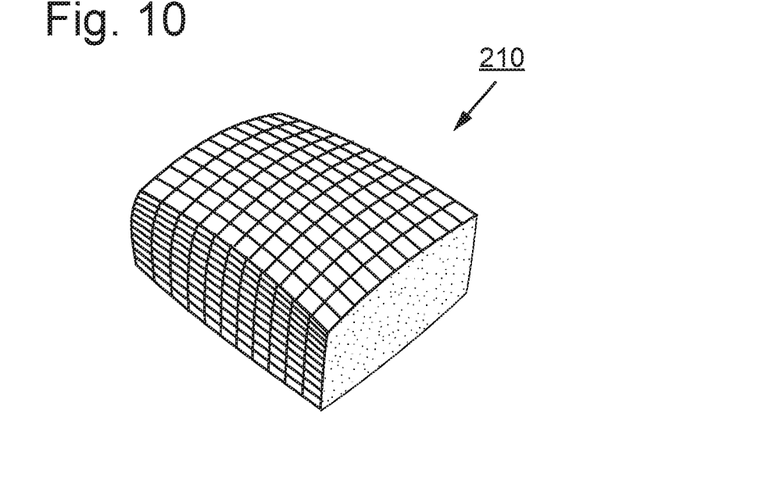
FIG. 10 is a perspective view of the electrically conductive sponge from FIG. 9.

FIG. 10 shows the exemplary electrically conductive sponge 210. This conductive sponge 210 is enclosed in a network of electrically conductive threads and may be impregnated with a conductive paste.

Figure 11:
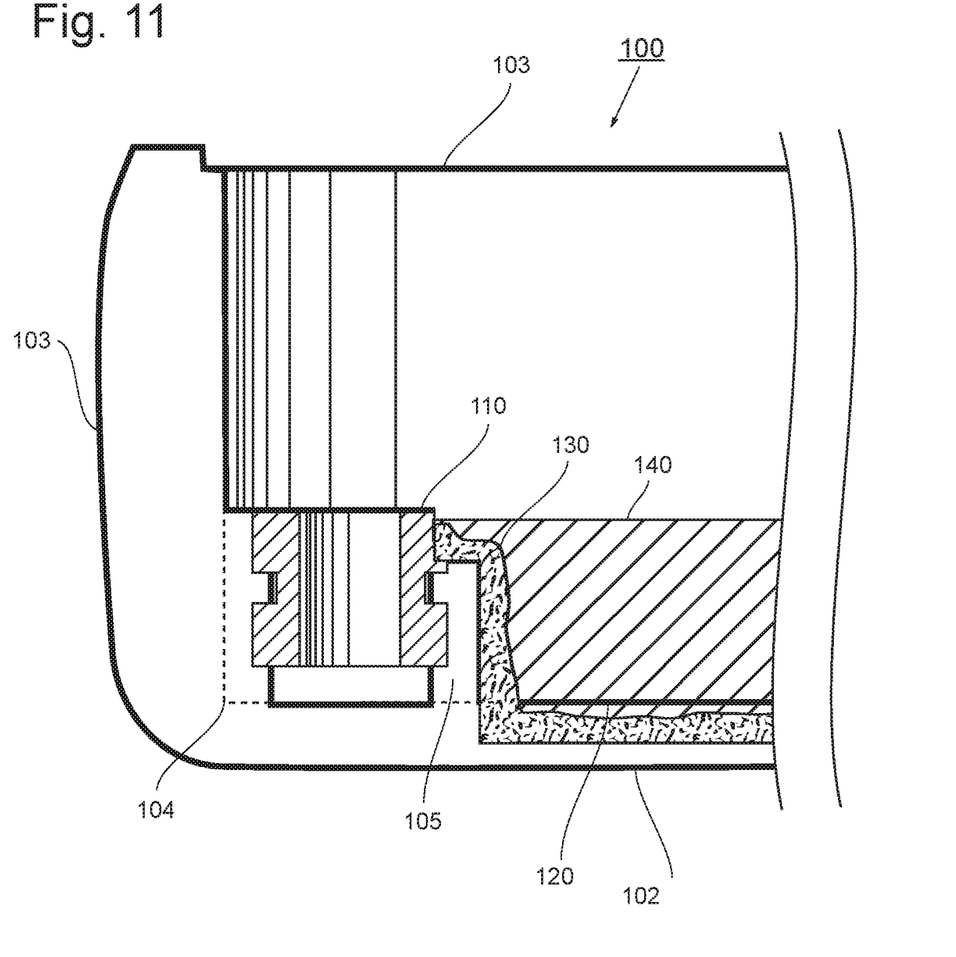
FIG. 11 shows an alternative exemplary arrangement of the housing part.

FIG. 11 shows an alternative arrangement of the housing part 100 according to an exemplary arrangement. This arrangement differs from the variant in FIG. 5 in that the electrically conductive mass 130 has an overlying plastic layer 140, which has preferably been bonded to the housing part 100 by overmolding. The plastic layer 140 stabilizes any loss of stability of the housing part 100 that may have been suffered by insertion of the groove 120 and provides electrical insulation of the electrically conductive mass 130.

Figure 12:
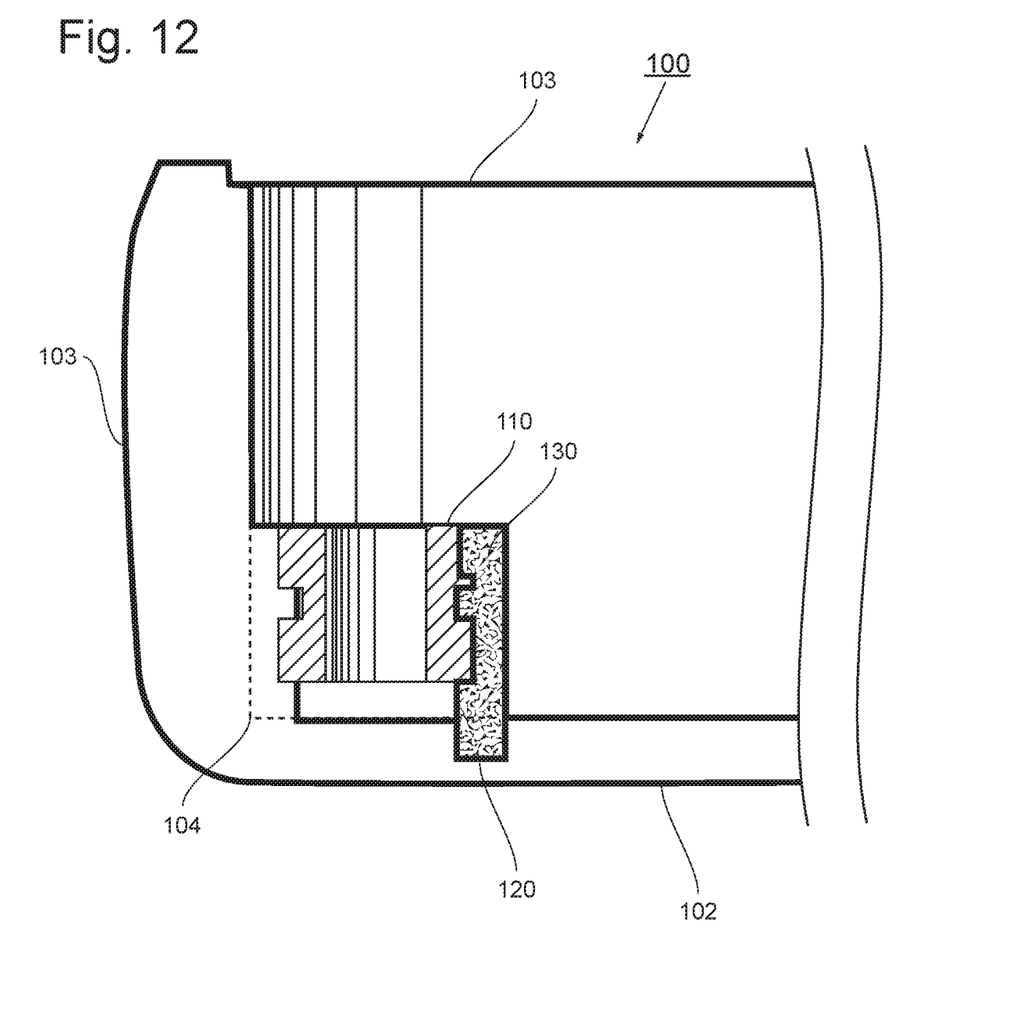
FIG. 12 shows another alternative exemplary arrangement of the housing part.

FIG. 12 shows yet another alternative arrangement of the housing part 100 according to an exemplary arrangement. In this arrangement, the conductive mass 130, which here is made of an electrically conductive plastic, comprises a piece that forms part of the step-shaped elevation 105. Here, the electrically conductive plastic piece of the electrically conductive mass 130 protrudes into the rear face 102 by standing in a groove 120, so that the electrically conductive plastic is in electrical contact with the individual fibers of the carbon fiber reinforced plastic of the rear face 102.

Thus the exemplary arrangements achieve improved capabilities and operation, eliminate difficulties encountered in the use of prior devices and systems, and attain the useful results described herein.

In the foregoing description certain terms have been used for brevity, clarity and understanding. However, no unnecessary limitations are to be implied therefrom because such terms are used for descriptive purposes only and are intended to be broadly construed. Moreover the descriptions and illustrations herein are by way of examples and the new and useful features are not limited to the exact features that have been shown or described.

It should further be understood that the features and/or relationships associated with one exemplary arrangement can be combined with features and/or relationships from another exemplary arrangement. That is, various features and/or relationships from various arrangements can be combined into further arrangements. The new and useful scope of the disclosure is not limited to only the arrangements that have been shown or described herein.

Having described features, discoveries and principles of the exemplary arrangements, the manner in which they are constructed and operated, and the advantages and useful results attained, the new and useful features, devices, elements, configurations, parts, combinations, systems, equipment, structures, operations, methods, processes and relationships are set forth in the appended claims.

| REFERENCE NUMERALS LIST | |
|---|---|
| 100 | housing part |
| 101 | carbon fiber |
| 102 | rear face |
| 103 | side edge |
| 104 | inner corner |
| 105 | elevation |
| 110 | threaded insert |
| 111 | milled spot |
| 120 | groove |
| 121 | line of extension |
| 130 | conductive mass |
| 140 | plastic |
| 210 | conductive sponge |
| 310 | support surface |
| 400 | circuit board |
| A | detail |
| B | section level |
| C | cut line |

The invention claimed is:

1. A housing part configured for use as a component of a housing of an electronic terminal, the housing part essentially consisting of carbon fiber-reinforced plastic,
the housing part having at least one device configured for galvanic connection with electronics arranged in the housing,
wherein adjacent to the at least one device configured for galvanic connection to the electronics arranged in the housing, at least one groove is present in the housing part, which groove is filled with a conductive mass, the conductive mass being galvanically connected to the at least one device,
wherein the conductive mass is configured for galvanic connection itself to the electronics arranged in the housing.

2. The housing part according to claim 1,
wherein the at least one device configured for galvanic connection with the electronics arranged in the housing is selected from the group consisting of: a metallic threaded insert, a conductive sponge, an electrically conductive support surface, and an electrically conductive plastic piece.

3. The housing part according to claim 1,
wherein the groove is comprises a milled groove in which carbon fibers of the carbon fiber-reinforced plastic are exposed, wherein the conductive mass is galvanically bonded to the exposed carbon fibers.

4. The housing part according to claim 1,
wherein the housing part has a lid-like structure including a substantially planar rear face and a side edge, wherein in an inner corner between the substantially planar rear face and the side edge there is a step-like elevation within which the at least one device configured for galvanic connection to the electronics arranged in the housing is positioned.

5. The housing part according to claim 1,
wherein the housing part has a lid-like structure including a substantially planar rear face and a side edge, wherein in an inner corner between the substantially planar rear face and the side edge there is a step-like elevation within which the at least one device configured for galvanic connection to the electronics arranged in the housing is positioned,
wherein the substantially planar rear face and side edge are comprised of bonded carbon fiber prepregs and the step-like elevation is comprised of a thermoplastic, wherein the carbon fiber prepregs and the thermoplastic are bonded together and comprise a composite material.

6. The housing part according to claim 1,
wherein the housing part has a lid-like structure including a substantially planar rear face and a side edge, wherein in an inner corner between the substantially planar rear face and the side edge there is a step-like elevation within which the at least one device configured for galvanic connection to the electronics arranged in the housing is positioned,
wherein the groove is meander-shaped and extends along a line of approximately parallel to the side edge.

7. The housing part according to claim 1,
wherein the housing part has a lid-like structure including a substantially planar rear face and a side edge, wherein in an inner corner between the substantially planar rear face and the side edge there is a step-like elevation within which the at least one device configured for galvanic connection to the electronics arranged in the housing is positioned,
wherein the substantially planar rear face and side edge are comprised of bonded carbon fiber prepreg layers and the step-like elevation is comprised of a thermoplastic, wherein the carbon fiber prepreg layers and the thermoplastic are bonded together and comprise a composite material,
wherein the at least one groove has a depth, wherein the depth is sufficient to completely penetrates at least one carbon fiber prepreg layer.

8. The housing part according to claim 1,
wherein the at least one device configured for galvanic connection comprises a metallic threaded insert,
wherein the metallic threaded insert includes a milled spot, wherein the conductive mass is galvanically connected to the milled spot.

9. The housing part according to claim 1,
wherein the conductive mass comprises silver ink, a silver-based and/or tin-based soft solder, or an electrically conductive plastic.

10. The housing part according to claim 1,
wherein the carbon fiber-reinforced plastic includes carbon fibers that have a length that extends over an entire length of the housing part.

11. The housing part according to claim 1,
and further including, an overmolded layer of plastic in covering overlying relation of the electrically conductive mass.

12. The housing part according to claim 1,
wherein the carbon-fiber-reinforced plastic includes an electrically conductive plastic,
wherein the electrically conductive carbon-fiber-reinforced plastic comprises either a single plastic layer or a composite material comprising more than one plastic layer.

13. The housing part according to claim 1,
wherein the carbon fiber-reinforced plastic comprises polypyrrole or at least one other doped or undoped polyannulated plastic, such as poly-3,4-ethylenedioxythiophene (PEDOT), polyaniline, polyparaphenylene or polythiophene or mixtures (compounds) thereof.

14. The housing part according to claim 1 wherein the terminal comprises a cell phone, a radio, a tablet computer or a mobile data acquisition device.

* * * * *